(12) United States Patent
Horiuchi et al.

(10) Patent No.: US 9,204,544 B2
(45) Date of Patent: Dec. 1, 2015

(54) WIRING SUBSTRATE AND METHOD OF MANUFACTURING THE SAME

(71) Applicant: SHINKO ELECTRIC INDUSTRIES CO., LTD., Nagano-shi (JP)

(72) Inventors: Michio Horiuchi, Nagano (JP); Ryo Fukasawa, Nagano (JP); Yuichi Matsuda, Nagano (JP); Yasue Tokutake, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 14/202,220

(22) Filed: Mar. 10, 2014

(65) Prior Publication Data

US 2014/0262465 A1 Sep. 18, 2014

(30) Foreign Application Priority Data

Mar. 14, 2013 (JP) ................................. 2013-051537

(51) Int. Cl.
*H05K 1/11* (2006.01)
*H01L 23/14* (2006.01)
*H01L 23/498* (2006.01)
*H01L 21/48* (2006.01)
*H05K 3/40* (2006.01)

(52) U.S. Cl.
CPC .............. *H05K 1/112* (2013.01); *H01L 21/486* (2013.01); *H01L 23/142* (2013.01); *H01L 23/49827* (2013.01); *H05K 3/4038* (2013.01); *H01L 2224/16225* (2013.01); *H01L 2924/15311* (2013.01); *H05K 3/4007* (2013.01); *H05K 2201/0133* (2013.01); *H05K 2201/10378* (2013.01); *H05K 2203/0315* (2013.01)

(58) Field of Classification Search
CPC ...... H05K 1/116; H05K 1/0306; H05K 1/204; H05K 1/201; H05K 1/206; H05K 1/111; H02G 15/043; H05B 3/56; H05B 3/06; H01L 23/142
USPC .......................................... 174/261, 252, 257
See application file for complete search history.

(56) References Cited

U.S. PATENT DOCUMENTS

| | | | |
|---|---|---|---|
| 4,942,400 A * | 7/1990 | Tarzaiski et al. | 341/155 |
| 5,331,514 A * | 7/1994 | Kuroda | 361/760 |
| 8,870,579 B1 * | 10/2014 | Weiss et al. | 439/66 |
| 2003/0201123 A1 * | 10/2003 | Kistner | 174/261 |
| 2005/0063166 A1 * | 3/2005 | Boggs et al. | 361/780 |
| 2007/0201247 A1 * | 8/2007 | Ohno et al. | 362/631 |
| 2010/0294552 A1 * | 11/2010 | Kobayashi et al. | 174/260 |

FOREIGN PATENT DOCUMENTS

| | | |
|---|---|---|
| JP | 2004-273480 A1 | 9/2004 |
| JP | 2009-147241 A1 | 7/2009 |

* cited by examiner

*Primary Examiner* — Steven T Sawyer
(74) *Attorney, Agent, or Firm* — Kratz, Quintos & Hanson, LLP (57) ABSTRACT

A wiring substrate includes, an insulating substrate in which a plurality of penetration conductors are provided, the penetration conductors penetrating in a thickness direction of the insulating substrate, a first connection pad arranged on one face of the insulating substrate, a second connection pad arranged to correspond to the first connection pad on other face of the insulating substrate, a first metal layer arranged to surround the first connection pad, a second metal layer arranged to correspond to the first metal layer, the second metal layer surrounding the second connection pad, the plurality of penetration conductors connecting the first connection pad and the second connection pad, and connecting the first metal layer and the second metal layer, and an elastic body formed in a part of the insulating substrate between the first and second connection pads, and the first and second metal layers.

4 Claims, 10 Drawing Sheets

FIG. 1C (partially plan view)

FIG. 2A

FIG. 2B (partially reduced plan view)

FIG. 4B oxygen plasma

FIG. 4C wet etching

WIRING SUBSTRATE AND METHOD OF MANUFACTURING THE SAME

CROSS-REFERENCE TO RELATED APPLICATIONS

This application is based upon and claims the benefit of priority of the prior Japanese Patent Application No. 2013-051537, filed on Mar. 14, 2013, the entire contents of which are incorporated herein by reference.

FIELD

The invention is related to a wiring substrate and a method of manufacturing the same.

BACKGROUND

In the prior art, there are wiring substrates for mounting semiconductor chips, or the like. As such a wiring substrate, a technique which uses a porous aluminum oxide substrate having many penetration conductors penetrating in the thickness direction, has been developed.

According to this technique, a wiring substrate that enables electric conduction between an upper side and a lower side is constructed on the basis of forming wirings on both faces of the aluminum oxide substrate in which the penetration conductors are formed, the wirings being connected to selected plural penetration conductors.

A related art is disclosed in Japanese Laid-open Patent Publication No. 2004-273480, and Japanese Laid-open Patent Publication No. 2009-147241.

SUMMARY

When a semiconductor chip is flip-chip connected to a wiring substrate formed of a porous aluminum oxide substrate, thermal stress is generated due to the difference in thermal expansion coefficient between the aluminum oxide substrate and the semiconductor chip. For this reason, it is sometimes difficult to reliably mount the semiconductor chip onto the wiring substrate.

According to one aspect discussed herein, there is provided a wiring substrate, including an insulating substrate in which a plurality of penetration conductors are provided, the penetration conductors penetrating in a thickness direction of the insulating substrate, a first connection pad arranged on one face of the insulating substrate, a second connection pad arranged to correspond to the first connection pad on other face of the insulating substrate, a first metal layer arranged to surround the first connection pad, a second metal layer arranged to correspond to the first metal layer, the second metal layer surrounding the second connection pad, the plurality of penetration conductors connecting the first connection pad and the second connection pad, and connecting the first metal layer and the second metal layer, and an elastic body formed in a part of the insulating substrate between a region where the first connection pad and second connection pad are arranged, and a region where the first metal layer and second metal layer are arranged.

Moreover, according to another aspect discussed herein, there is provided a method of manufacturing a wiring substrate, including preparing an insulating substrate including a plurality of through-holes, forming an insulating layer having an annular pattern on the insulating substrate, forming a seed metal layer on the insulating substrate and the insulating layer, filling penetration conductors into the through-holes of the insulating substrate by electroplating using the seed metal layer as a power feeding path, forming an opening portion by removing a part of the insulating substrate under the insulating layer, and filling an elastic body into the opening portion of the insulating substrate.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENT

Hereinbelow, an embodiment of the present invention will be explained with reference to the accompanying drawings.

Figure 5:
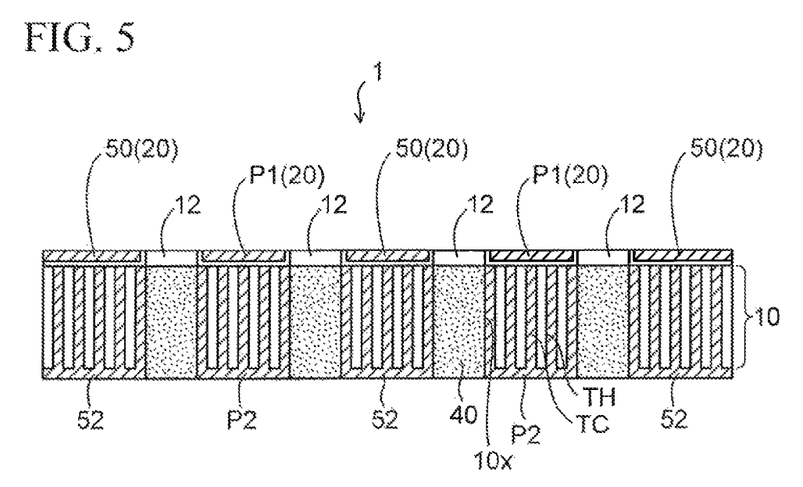
FIG. 5 is a cross-sectional view depicting a wiring substrate of the embodiment.
Figure 6A:
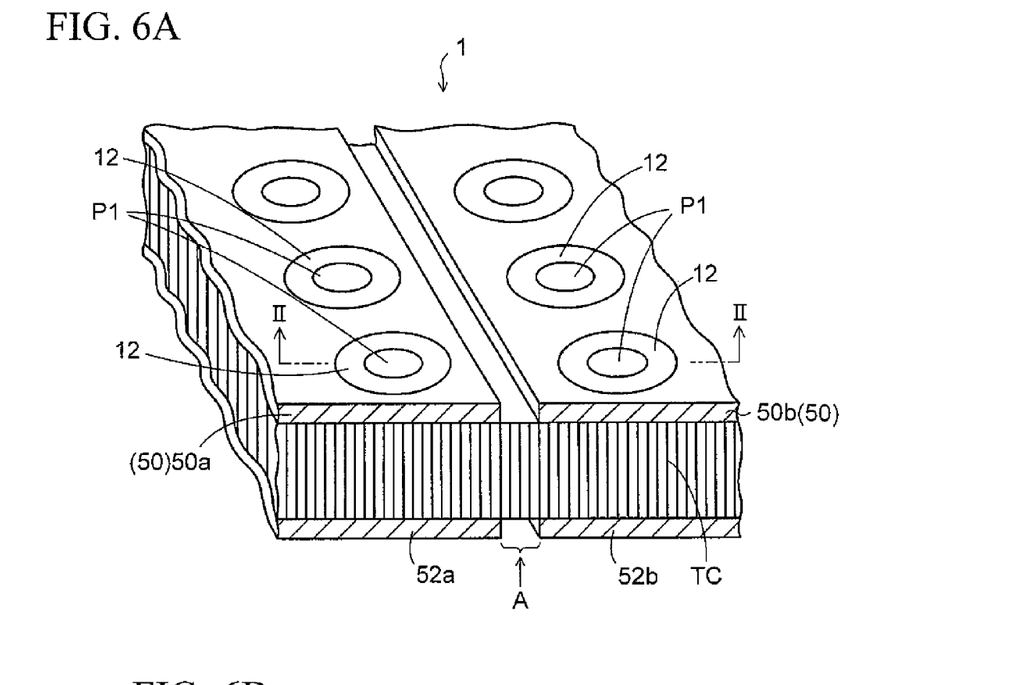
FIGS. 6A and 6B are a cross-sectional perspective view and cross-sectional view depicting the wiring substrate of the embodiment.
Figure 6B:
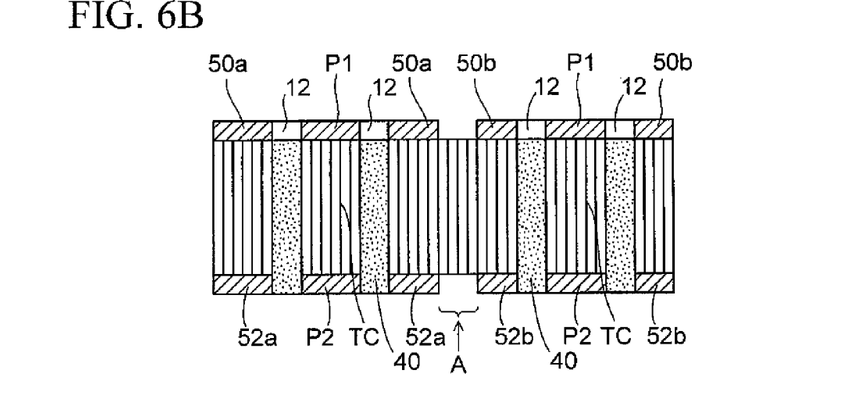

FIGS. 1A to 4C are views depicting a method of manufacturing a wiring substrate of an embodiment. FIG. 5 and FIGS. 6A and 6B are views depicting a wiring substrate of the embodiment. Hereinafter, while explaining a method of manufacturing a wiring substrate, a structure of a wiring substrate will be explained.

Figure 1A:
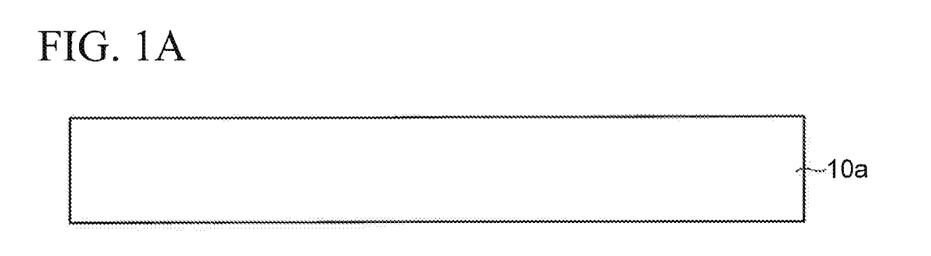
FIGS. 1A to 1C are cross-sectional views and a plan view depicting a method of manufacturing a wiring substrate of an embodiment (Part 1).
Figure 1B:
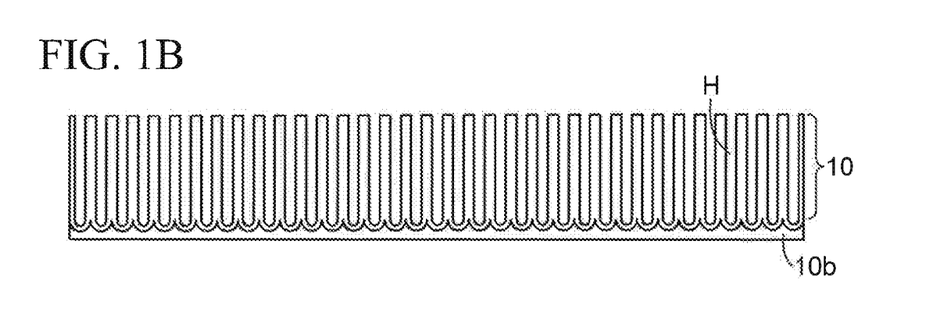

In the method of manufacturing a wiring substrate of the embodiment, as depicted in FIG. 1A, first, an aluminum (Al) substrate 10a is prepared. Then, as depicted in FIG. 1B, an aluminum oxide substrate 10 is obtained by electrochemically oxidizing the aluminum substrate 10a, by applying the electrolysis to the aluminum substrate, while using oxalic acid solution, or the like as a processing bath and while using the aluminum substrate 10a as an anode.

At this time, many fine holes H are simultaneously formed from the surface of the aluminum oxide substrate 10 toward the thickness direction. Moreover, it is in a state that a thin aluminum portion 10b which is not anodized remains to the lower side of the aluminum oxide substrate 10.

Figure 1C:
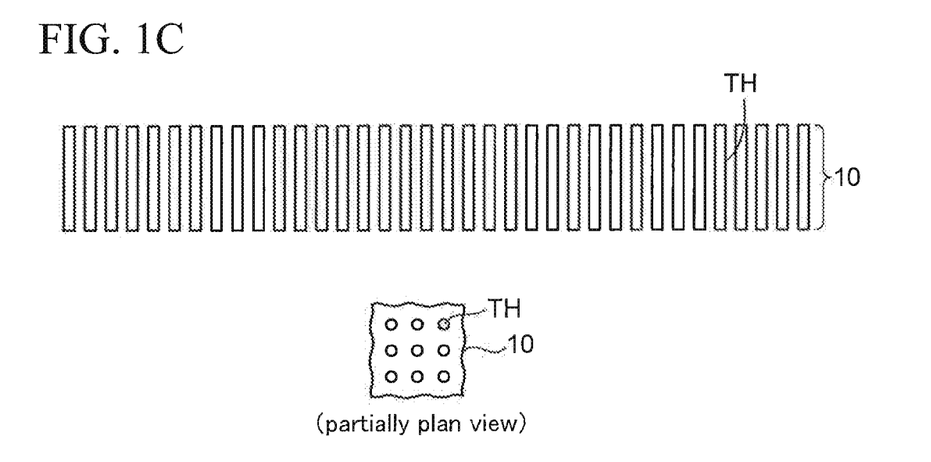

Thereafter, as depicted in FIG. 1C, the aluminum portion 10b remaining to the lower side of the aluminum oxide substrate 10 is removed by etching. By this matter, an aluminum oxide substrate 10 is obtained in which many through-holes TH penetrating from the upper face to the lower face are provided side by side to the lateral direction.

As depicted in the partially plan view in FIG. 1C, the many through-holes TH are arranged side by side to the substrate direction in a state that the through-holes TH are separated each other through the aluminum oxide substrate 10.

In a preferred example, the thickness of the aluminum oxide substrate 10 is set to about 70 µm, to 120 µm, the diameter of each of the through-holes TH is set to 60 nm to 200 nm, and the pitch of the through-holes TH is set to 100 nm to 300 nm.

Note that in the anodizing step in FIG. 1B, the aluminum substrate 10a may be anodized in a state that a protection metal layer (not depicted) is formed on the lower face of the aluminum substrate 10a. In this case, the anodization can be done to a part nearer to the lower face of the aluminum substrate 10a. Then, the protection metal layer and the aluminium portion 10b are removed by etching.

As an example of the insulating substrate in which many through-holes are provided, The porous aluminum oxide substrate 10 in which the through-holes TH are provided is illustrated. But, it may anodize a titanium (Ti) substrate and use the porous titanium oxide substrate in which many through-holes are provided. Otherwise, it may form many through-holes in an insulating substrate formed of the ceramic or the like by a laser or the like.

Figure 2A:
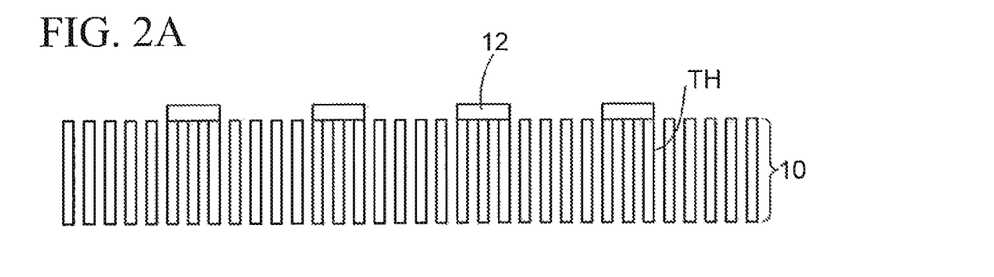
FIGS. 2A to 2D are cross-sectional views and a plan view depicting the method of manufacturing a wiring substrate of the embodiment (Part 2).

Thereafter, as depicted in FIG. 2A, a permanent resist layer 12 is formed on the basis of the photolithography on the aluminum oxide substrate 10 in which the many through-holes TH are provided. The permanent resist layer 12 is fully cured, and is finally left in the wiring substrate as an insulating layer.

Figure 2B:
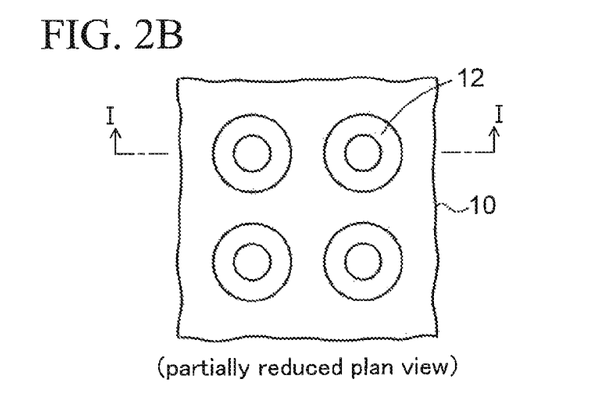

FIG. 2B is a partially reduced plan view that the cross-sectional view of FIG. 2A is seen from the plane. FIG. 2A corresponds to an enlarged cross-sectional view taken along line I-I in FIG. 2B. In FIG. 2B, the through-holes TH of the aluminum oxide substrate 10 are omitted.

As depicted in FIG. 2B, the permanent resist layer 12 is formed in an annular pattern, and has an opening portion arranged on an inner part thereof. The opening portion of the permanent resist layer 12 is defined as a region where a connection pad is arranged. The thickness of the permanent resist layer 12 is set to 10 µm to 20 µm, for example.

The annular pattern may be in any shape such as a circular shape or a quadrangle shape, and may have the shape that surrounds one region. The permanent resist layer 12 is illustrated as an example of the insulating layer. Various other insulating materials are available for the insulating layer.

Figure 2C:
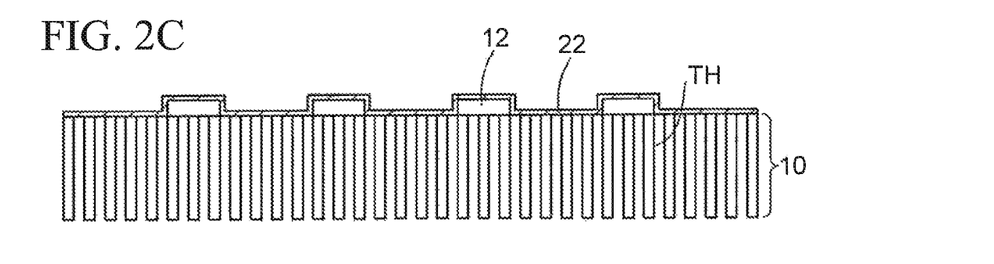

Thereafter, as depicted in FIG. 2C, an underlying metal layer 22 is formed by sputtering on the aluminum oxide substrate 10 and the permanent resist layer 12. The underlying metal layer 22 is formed of copper or the like, and its thickness is set to 0.5 µm to 1 µm.

Figure 2D:
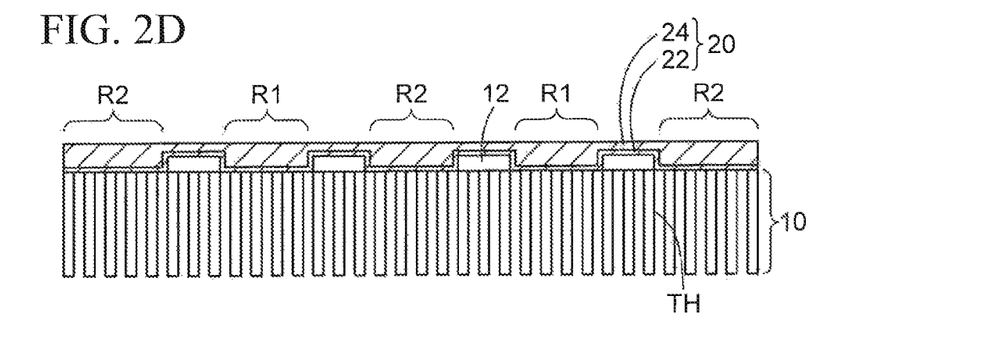

Then, as depicted in FIG. 2D, a metal plating layer 24 made of copper or the like is formed on the underlying metal layer 22 by electroplating utilizing the underlying metal layer 22 as a plating power feeding path. By adjusting the condition for the electroplating, the metal plating layer 24 is formed to bury the level difference of the permanent resist layer 12 so that the upper face of the metal plating layer 24 is formed as a flat face over all.

The electroplating solution used in this step contains an accelerating agent which accelerates deposition of metal on a concave portion and an inhibiting agent which inhibits deposition of the metal on a convex portion. By this matter, the metal plating layer 24 whose upper face is flat can be formed on the aluminum oxide substrate 10 having the level difference of the permanent resist layer 12.

As the condition for such electroplating, it is possible to employ a condition to bury a through-hole or a via hole in the general build-up wiring with a metal plating layer.

Since the metal plating layer 24 needs to be formed to bury the permanent resist layer 12, the metal plating layer 24 is formed to have a thickness of about 25 µm to 30 µm from the upper face of the aluminum oxide substrate 10.

In this way, a seed metal layer 20 formed of the underlying metal layer 22 and the metal plating layer 24 having a flat upper face is obtained on the aluminum oxide substrate 10 and the permanent resist layer 12.

In the example of FIG. 2D, a region R1 in which a connection pad is arranged, and a region R2 in which a metal layer surrounding the connection pad is arranged, are defined. The region R1 in which the connection pad is arranged is an inner region of the annular permanent resist layer 12. Moreover, the region R2 in which the metal layer is arrange is an outer region of the annular permanent resist layer 12.

Figure 3A:
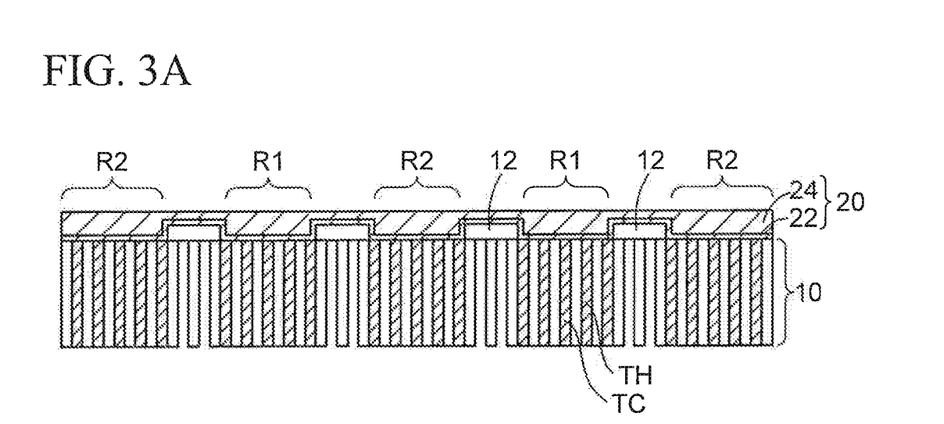
FIGS. 3A to 3C are cross-sectional views depicting the method of manufacturing a wiring substrate of the embodiment (Part 3).

Then, as depicted in FIG. 3A, a penetration conductor TC made of copper or the like is formed to be filled in each through-hole TH in the aluminum oxide substrate 10 by electroplating utilizing the seed metal layer 20 as a plating power feeding path.

At this time, the metal plating is applied to each through-hole TH in the part on which the seed metal layer 20 is arranged gradually from the seed metal layer 20 side toward the lower opening end of the through-hole TH, so that the penetration conductor TC is filled into the through-hole TH in that region.

Figure 3B:
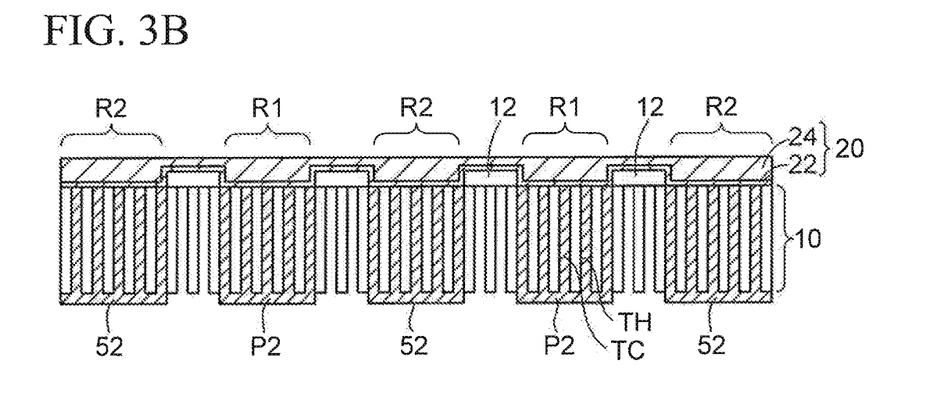

Further, as depicted in FIG. 3B, after the penetration conductors TC are formed, the electroplating is continuously performed, thereby a metal plating layer is formed on the lower face of the aluminum oxide substrate 10, the metal plating layer being connected to the plurality of penetration conductors TC.

By this matter, in each region R1 in which the connection pad is arranged, a second connection pad P2 is formed on the lower face of the aluminum oxide substrate 10, and is connected to the plurality of penetration conductors TC. Moreover, in the region R2 in which the metal layer is arranged, a second metal layer 52 is formed on the lower face of the aluminum oxide substrate 10, and is connected to the plurality of penetration conductors TC. The second connection pad P2 and the second metal layer 52 are formed to protrude downward from the lower face of the aluminum oxide substrate 10.

On the other hand, the electric power is not applied to each through-hole TH in the part on which the permanent resist layer 12 is arranged, therefore the metal plating is not applied. Thus, it is in a state that the through-holes TH in that region remain as the hollow without change.

In this way, in the part of the aluminum oxide substrate 10 on which the seed metal layer 20 is arranged, the plurality of penetration conductors TC, and the second connection pad P2 and the second metal layer 52 connected to the plurality of penetration conductors TC are formed in a self-aligning manner by electroplating.

Then, as will be described later, the seed metal layer 20 is removed to a halfway position of a thickness, thus, a first connection pad P1 formed of the seed metal layer 20 is arranged in each region R1, and a first metal layer 50 formed of the seed metal layer 20 is arranged in the region P2.

For this reason, in each region R1 in which the connection pad is arranged, the second connection pad P2 is arranged in a self-aligning manner at a position corresponding to the first connection pad P1. Accordingly, there is no fear that the first connection pad P1 and the second connection pad P2 are arranged to be misaligned each other. Moreover, in the region R2 in which the metal layer is arrange as well, similarly the second metal layer 52 is formed in a self-aligning manner at a position corresponding to the first metal layer 50.

By using the porous aluminum oxide substrate 10, the penetration conductors TC are formed at a density in a range of $4 \times 10^6$ conductors/mm$^2$ to $1 \times 10^{10}$ conductors/mm$^2$.

Figure 3C:
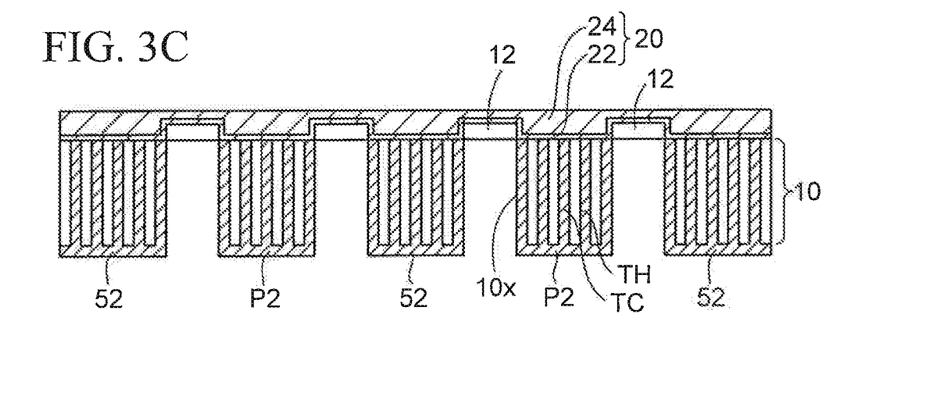

Then, as depicted in FIG. 3C, the regions of the aluminum oxide substrate 10 where the penetration conductors TC are not formed are removed by wet etching using a strong base solution such as sodium hydroxide (NaOH) aqueous solution as the etchant.

By this matter, opening portions 10x are formed in the parts of the aluminum oxide substrate 10 corresponding to the annular permanent resist layers 12. Each opening portion 10x of the aluminum oxide substrate 10 is formed with an annular shape in the periphery of the second connection pad P2 in a plan view.

At this time, it is in a state that the aluminum oxide substrate 10 is arranged between the plurality of penetration conductors TC in the side face of each opening portion 10x. Since the gap between the penetration conductors TC is about 40 nm, which is extremely fine, the aluminum oxide substrate 10 in the side face of the opening portion 10x has low wettability, therefore the etchant is not supplied.

For this reason, at the point that the penetration conductors TC are exposed in the side face of the opening portion 10x, the etching rate of the aluminum oxide substrate 10 becomes extremely lower than that in the thickness direction of the substrate. Thus, even when the etching in the thickness direction of the substrate is completed, the etching toward the plane direction of the substrate does not progress. Accordingly, the aluminum oxide substrate 10 is left between the penetration conductors TC.

Figure 4A:
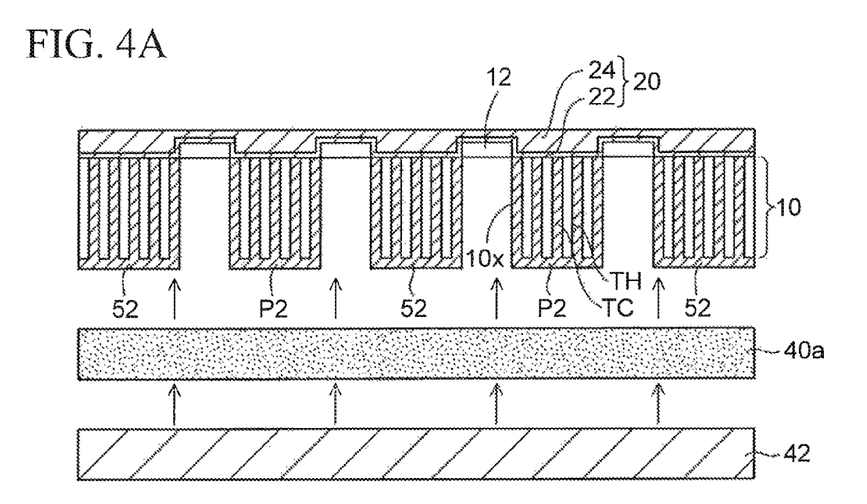
FIGS. 4A to 4C are cross-sectional views depicting the method of manufacturing a wiring substrate of the embodiment (Part 4).

Then, as depicted in FIG. 4A, a thermosetting resin film 40a is prepared, and the resin film 40a is pushed into the opening portions 10x of the aluminum oxide substrate 10 by a pressing member 42. This process is performed while heating at a temperature of 180° C. to 200° C. in a processing chamber of the vacuum condition.

Figure 4B:
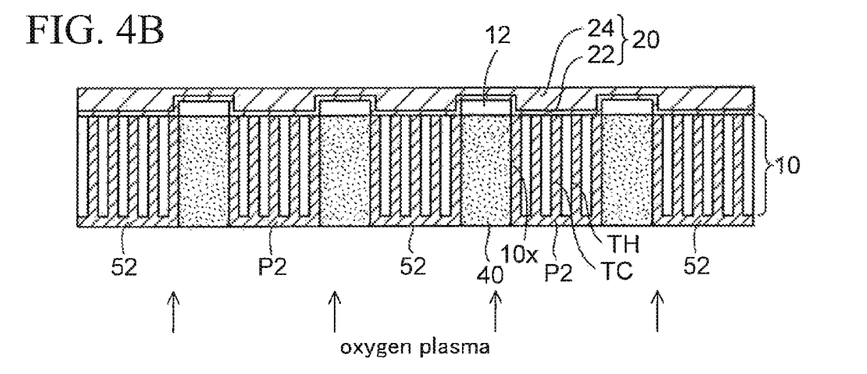

By this matter, as depicted in FIG. 4B, the resin film 40a flows, thereby the resin is filled in the opening portions 10x of the aluminum oxide substrate 10, and elastic body 40 is formed.

As an alternative method, a liquid thermosetting resin which functions as an elastic body may be filled into the opening portions 10x of the aluminum oxide substrate 10 by a dispenser or the like to obtain the elastic body 40.

As preferred examples of the thermosetting resin, there is a silicone resin, an olefin resin, or the like, and their elastic modulus is 0.2 MPa to 100 MPa.

Otherwise, besides the thermosetting resin, a thermoplastic resin which functions as the elastic body may be used. As preferred examples of the thermoplastic resin, there is a polyamide resin having the elastic modulus of about 60 MPa, or the like.

Besides the above-mentioned resin materials, if it is materials having low elastic modulus of 100 MPa or less, the materials can be used as the elastic body. A rubber material may be used as the elastic body 40.

Then, as depicted in FIG. 4Bc similarly, in the case that the thin film of the resin (not depicted) adheres to the lower face of the aluminum oxide substrate 10 and remains, the resin is removed by oxygen ($O_2$) plasma using a drying etching apparatus, thereby the lower faces of the second connection pads P2 and the second metal layer 52 are exposed.

In the case that the elastic body 40 can be formed such that resin does not remain on the lower face of the aluminum oxide substrate 10, the oxygen plasma processing is omitted.

Figure 4C:
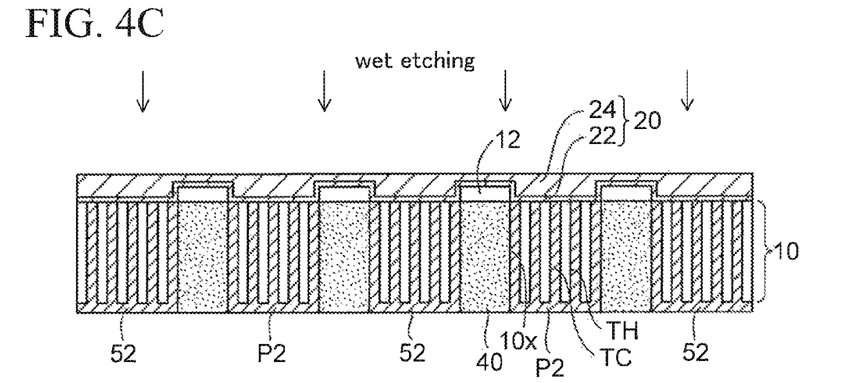

Then, as depicted in FIGS. 4C and 5, the seed metal layer 20 is wet etched to a halfway position of a thickness, thereby the upper face of the permanent resist layer 12 is exposed.

In the case that the seed metal layer 20 is formed of copper, copper(II) chloride aqueous solution, iron (III) chloride aqueous solution, or the like is used as the etchant.

Since the upper face of the seed metal layer 20 is flat over all, the seed metal layer 20 is left in the concave regions between the permanent resist layer 12 by half-etching the seed metal layer 20 until the upper face of the permanent resist layer 12 is exposed.

Instead of the wet etching, the seed metal layer 20 may be ground by the polishing process such as CMP (Chemical Mechanical Polishing) to expose the upper face of the permanent resist layer 12. That is, the seed metal layer 20 may be removed by various methods until the upper face of the permanent resist layer 12 is exposed.

In this way, as depicted in FIG. 5, the first connection pad P1 formed of the seed metal layer 20 is arranged to the inside of the annular permanent resist layer 12. Also simultaneously, the first metal layer 50 formed of the seed metal layer 20 is arranged to the outside of the annular permanent resist layer 12. The first connection pad P1 and the first metal layer 50 are separated and electrically insulated through the annular permanent resist layer 12.

Here, in the above-described case, after the elastic body 40 is filled in the opening portions 10x of the aluminum oxide substrate 10 to obtain sufficient substrate strength, the seed metal layer 20 is removed until the permanent resist layer 12 is exposed.

Besides this, If there is no problem in particular, after the step of forming the penetration conductors TC in FIG. 3B, or after the step of forming the opening portions 10X in FIG. 3C, the seed metal layer 20 may be removed to the halfway position of the thickness, By the above steps, as depicted in FIG. 5, a wiring substrate 1 of the embodiment is obtained.

First, the basic structure of the wiring substrate 1 of the embodiment will be explained with reference to FIG. 5. As depicted in FIG. 5, in the wiring substrate 1 of the embodiment, the first connection pads P1 are arranged on one face of the aluminum oxide substrate 10.

Moreover, the second connection pads P2 are arranged to correspond to the first connection pads P1 on the other face of the aluminum oxide substrate 10. Each first connection pad P1 and the second connection pad P2 are connected each other by the plurality of penetration conductors TC formed in the aluminum oxide substrate 10.

Moreover, the first metal layer 50 is arranged on the one face of the aluminum oxide substrate 10 so as to surround the first connection pad P1. Further, the second metal layer 52 is arranged to correspond to the first metal layer 50 on the other face of the aluminum oxide substrate 10 so as to surround the second connection pad P2.

The first metal layer 50 and the second metal layer 52 on both sides are connected each other by the plurality of penetration conductors TC formed in the aluminum oxide substrate 10.

The elastic body 40 is integrally formed in the annular parts of the aluminum oxide substrate 10 between the first connection pads P1 and the first metal layer 50 and penetrates the aluminum oxide substrate 10 in the thickness direction. Moreover, the permanent resist layer 12 is arranged on the aluminum oxide substrate 10 in the annular regions between the first connection pads P1 and the first metal layer 50.

Next, referring to FIGS. 6A and 6B, more detailed explanation will be given while explaining a case that the first and second metal layers 50, 52 in FIG. 5 are divided, and a power plane and a ground plane are formed. In this embodiment, the power plane and the ground plane are illustrated as an example of a power pattern and a ground pattern.

FIG. 6A is a cross-sectional perspective view that a cross section of the wiring substrate of the embodiment is seen with the perspective view. FIG. 6B corresponds to a cross-sectional view taken along line II-II in FIG. 6A.

As depicted in FIGS. 6A and 6B, in the wiring substrate 1 of the embodiment, the plurality of first connection pads P1 having a circular shape are arranged on the one face of the aluminum oxide substrate 10 in a state that the first connection pads P1 are separated each other. The aluminum oxide substrate 10 is an example of the insulating substrate.

Then, a first power plane 50a is arranged so as to concentrically surround the first connection pads P1. Also similarly, a first ground plane 50b is arranged so as to concentrically surround the first connection pads P1.

The first power plane 50a and the first ground plane 50b are separated at a center part of the upper side of the aluminum oxide substrate 10, and are electrically insulated. Further, the permanent resist layer 12 is arranged on the aluminum oxide substrate 10 in the annular regions between the first connection pads P1 and the first metal layer 50. The permanent resist layer 12 is an example of the insulating layer.

Moreover, each of the first power plane 50a and the first ground plane 50b is formed as a single plane layer integrally on the aluminum oxide substrate 10 in regions excluding the first connection pads P1 and the permanent resist layer 12, respectively.

Focusing on FIG. 6B, the plurality of penetration conductors TC are arranged in the parts of the aluminum oxide substrate 10 corresponding to the first connection pads P1. The first connection pads P1 and the plurality of penetration conductors TC thereunder are electrically connected.

Moreover, in the other face of the aluminum oxide substrate 10, the second connection pads P2 are formed on the parts corresponding to the first connection pads P1 and are connected to the plurality of penetration conductors TC. By this matter, the first connection pad P1 is electrically connected to the second connection pad P2 through the plurality of penetration conductors TC.

Moreover, the plurality of penetration conductors TC are arranged in the parts of the aluminum oxide substrate 10 corresponding to the first power plane 50a and the first ground plane 50b. In the other face of the aluminum oxide substrate 10, the second power plane 52a is formed on the part corresponding to the first power plane 50a and is connected to the plurality of penetration conductors TC. By this matter, the first power plane 50a is electrically connected to the second power plane 52a through the plurality of penetration conductors TC.

Also similarly, in the other face of the aluminum oxide substrate 10, the second grand plane 52b is formed on the part corresponding to the first ground plane 50b and is connected to the plurality of penetration conductors TC. By this matter, the first ground plane 50b is electrically connected to the second grand plane 52b through the plurality of penetration conductors TC.

In this embodiment, the first metal layer 50 surrounding the first connection pads P1 are divided into two parts, and the first power plane 50a and the first ground plane 50b are constituted. But, the number of divided parts can be set to any suitable number (two or more). Moreover, the second metal layer 52 surrounding the second connection pads P2 is also divided into any suitable number according to the division of the first metal layer 50.

As described in the foregoing manufacturing method, the penetration conductors TC are filled by electroplating into the plurality of through-holes TH in the aluminum oxide substrate 10 under the seed metal layer 20 which will become the first connection pads P1, and thereafter the second connection pads P2 connected to those penetration conductors TC are formed.

By this matter, the second connection pads P2 are arranged in a self-aligning manner in the regions corresponding to the first connection pads P1. Accordingly, even when the pitch of the connection pads is narrowed, there is no fear that the first connection pads P1 and the second connection pads P2 are misaligned and have a short circuit with the penetration conductors TC of a different electric system.

Moreover, the elastic body 40 is integrally filled in the parts of the aluminum oxide substrate 10 corresponding to the permanent resist layer 12 in the periphery of the first connection pads P1 so as to penetrate the aluminum oxide substrate 10 in the thickness direction thereof.

In this way, in the wiring substrate 1 of this embodiment, a coaxial structure in which the elastic body 40 having the insulating property is integrally arranged in the periphery of a vertical connection wiring that the plurality of penetration conductors TC is connected to the first and second connection pads P1, P2, is employed.

Further, the first ground plane 50b can be easily arranged so as to surround the first connection pads P1. For this reason, even when the pitch of the connection pads is narrowed, cross talk in a high frequency circuit can be reduced.

Moreover, in order to reduce the radiation noise due to the resonance between the power and the ground, it is preferable that a capacitor having a relatively large capacitance is arranged between the power planes 50a, 52a and the ground planes 50b, 52b.

In view of this, in FIGS. 6A and 6B, the plurality of penetration conductors TC are arranged also in the aluminum oxide substrate 10 in a region A between the power planes 50a, 52a and the ground planes 50b, 52b. The plurality of penetration conductors TC arranged in the aluminum oxide substrate 10 in this region A are electrically isolated and are not connected to the other conductors.

By this matter, a capacitor is formed by the power planes 50a, 52a, the aluminum oxide substrate 10 arranged between the penetration conductors TC, and the ground planes 50b, 52b.

The capacitor formed by this can obtain a larger capacity than when the elastic body 40 having insulating property is integrally filled in the aluminum oxide substrate 10 in the region A between the power planes 50a, 52a and the ground planes 50b, 52b. For this reason, the reduction effect of the radiation noise can be enhanced.

Here, referring to FIGS. 7A to 8D, the explanation will be given of a manufacturing method involving separating the power planes 50a, 52b and the ground planes 50b, 52b, and arranging the plurality of penetration conductors TC in the aluminum oxide substrate 10 in the region A between them.

Figure 7A:
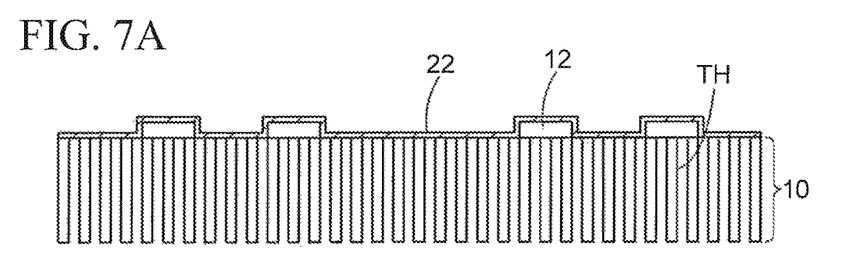
FIGS. 7A to 7D are cross-sectional views depicting a method of forming power planes and ground planes in a separated manner in the method of manufacturing a wiring substrate of the embodiment (Part 1).

As depicted in FIG. 7A, by the similar method to FIGS. 1A to 2C mentioned above, the aluminum oxide substrate 10 in which many through-holes TH are provided is made, and the annular permanent resist layer 12 is formed, and then the underlying metal layer 22 is formed.

Figure 7B:
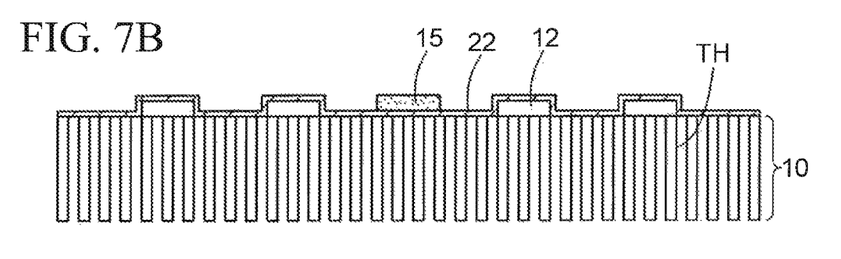
Figure 7C:
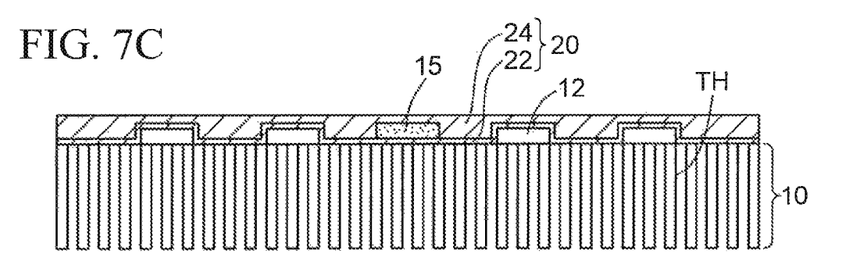

Then, as depicted in FIG. 7B, a photoresist layer 15 is formed by a dispenser or the like with a straight line pattern on a part of the underlying metal layer 22 at which a first power plane 50a and a first ground plane 50b are to be separated. Further, as depicted in FIG. 7C, by the similar method to FIG. 2D mentioned above, the metal plating layer 24 is formed on the underlying metal layer 22 and the photoresist layer 15 to obtain a seed metal layer 20.

Figure 7D:
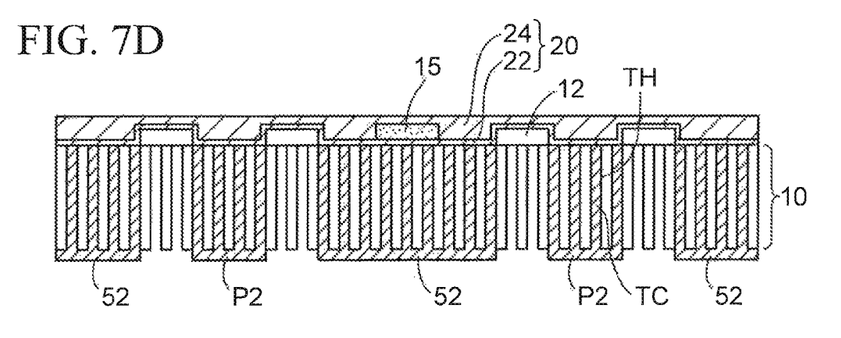

Thereafter, as depicted in FIG. 7D, by the similar manner to FIGS. 3A and 3B mentioned above, the penetration conductors TC are filled into the through-holes TH in the part of the aluminum oxide substrate 10 on which the seed metal layer 20 is arranged. The above step is further continued to form second connection pads P2 and a second metal layer 52 which are connected to the plurality of penetration conductors TC.

Figure 8A:
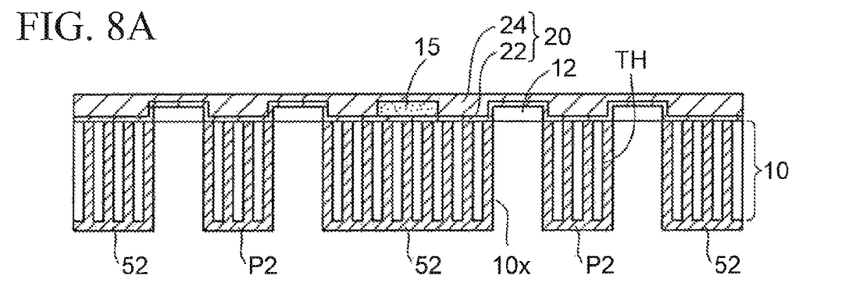
FIGS. 8A to 8D are cross-sectional views depicting the method of forming power planes and ground planes in a separated manner in the method of manufacturing a wiring substrate of the embodiment (Part 2).

Then, as depicted in FIG. 8A, by the similar manner to FIG. 3C mentioned above, the parts of the aluminum oxide substrate 10 on which the permanent resist layer 12 is arranged are removed to form opening portions 10x.

Figure 8B:
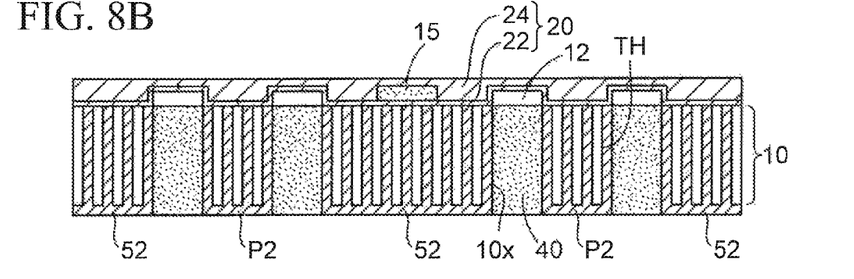

Thereafter, as depicted in FIG. 8B, by the similar manner to FIG. 4A mentioned above, the elastic body 40 is filled into the opening portions 10x of the aluminum oxide substrate 10.

Figure 8C:
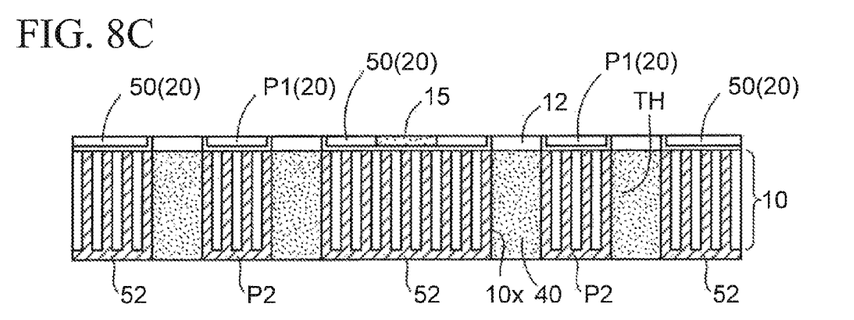

Then, as depicted in FIG. 8C, similarly to FIGS. 4C and 5 mentioned above, the seed metal layer 20 is removed to the halfway position of the thickness, thereby each of the upper face of the permanent resist layer 12 and the photoresist layer 15 is exposed. By this matter, first connection pads P1 and the first metal layer 50 are obtained in concave regions in the lateral direction of the permanent resist layer 12 and the photoresist layer 15.

Figure 8D:
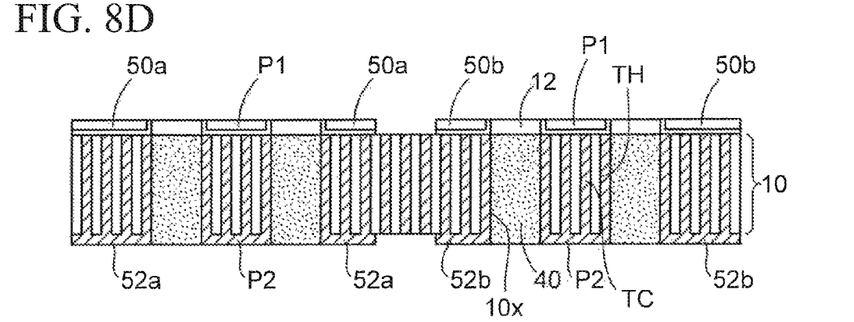

Further, as depicted in FIG. 8D, the photoresist layer 15 is removed by a stripper, and then the underlying metal layer 22 in the bottom part of the removed space is removed by the wet etching. At this time, the permanent resist layer 12 is already fully cured and therefore is left without being removed by the stripper.

By this matter, in the upper face of the aluminum oxide substrate 10, the first power plane 50a and the first ground plane 50b are arranged to be separated.

Thereafter, in the lower face of the aluminum oxide substrate 10, a part where the second metal layer 52 is to be divided is removed by photolithography and wet etching. By this matter, the second power plane 52a and the second ground plane 52b are arranged to be separated on the lower face of the aluminum oxide substrate 10 as well.

Note that in the case that the thickness of the seed metal layer 20 is relatively thin, the photoresist layer 15 may not be formed in FIG. 7B mentioned above. Instead, the seed metal layer 20 may be formed also in the separating part, and the part where the seed metal layer 20 is to be divided may be removed by photolithograph and etching.

Also, the following method may be employed as an alternative method for dividing the second metal layer 52 on the lower face of the aluminum oxide substrate 10. First, in the step of filling the penetration conductors TC in FIG. 7D mentioned above, the penetration conductors TC are filled up to the lower opening ends of the through-holes TH in the aluminum oxide substrate 10, and then the electroplating is temporarily stopped. Thereafter, a photoresist layer having a straight line pattern is formed by a dispenser or the like on the dividing part of the lower face of the aluminum oxide substrate 10.

Then, the electroplating is applied again to the aluminum oxide substrate 10 to form the second connection pads P2 and the second metal layer 52 which are connected to the penetration conductors TC. Then, the photoresist layer is removed. By this matter, the second metal layer 52 is formed in a state that it is divided into the second power plane 52a and the second ground plane 52b by the photoresist layer.

By the above method, it is possible to manufacture a structure in which the power planes 50a, 52a and the ground planes 50b, 52b are separated and the plurality of penetration conductors TC are arranged in the aluminum oxide substrate 10 in the region between them.

Figure 9:
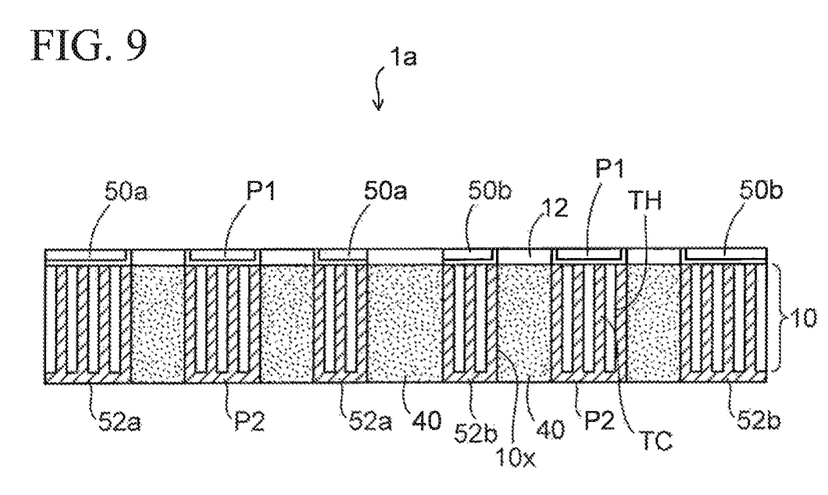
FIG. 9 is a cross-sectional view depicting a wiring substrate of a modification of the embodiment.

Otherwise, like a wiring substrate 1a of a modification depicted in FIG. 9, in the case that the radiation noise due to the resonance between the power and the ground is not problematic, the elastic body 40 may be filled integrally in the aluminum oxide substrate 10 in the region between the power planes 50a, 52a and the ground planes 50b, 52b.

In this case, in the step in FIG. 7A mentioned above, before the underlying metal layer 22 is formed, the permanent resist layer 12 may be formed also on the part of the aluminum oxide substrate 10 at which the first power plane 50a and first ground plane 50b are to be separated.

Figure 10:
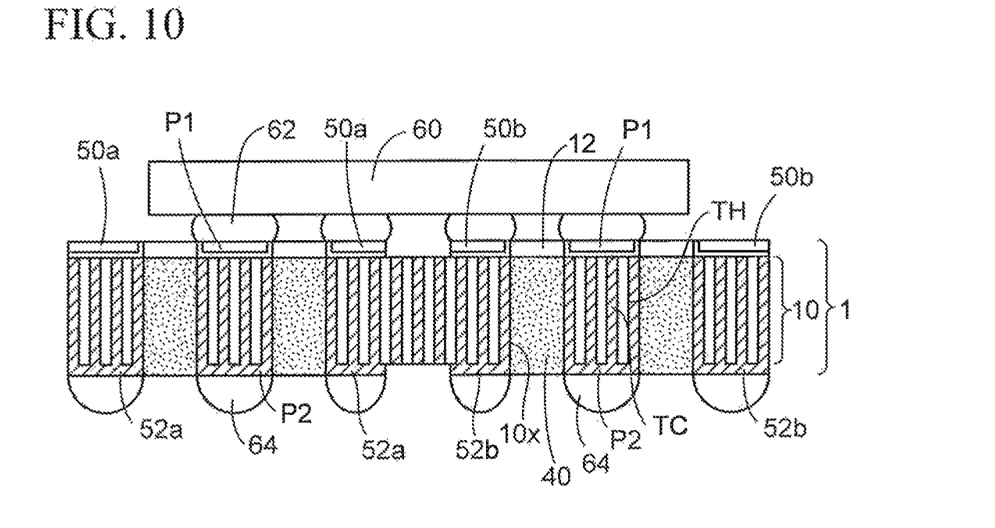
FIG. 10 is a cross-sectional view depicting a state that a semiconductor chip is flip-chip connected to the wiring substrate of the embodiment.

FIG. 10 depicts an example of a semiconductor device in which a semiconductor chip is flip-chip connected to the wiring substrate of the embodiment.

As depicted in FIG. 10, electrodes of the semiconductor chip 60 are arranged on the first connection pads P1 and each connecting part of the first power plane 50a and the first ground plane 50b of the wiring substrate 1 in FIG. 8D mentioned above through the solder therebetween.

Further, reflow heating is performed at a temperature of around 250° C. to flip-chip connect the semiconductor chip 60 to the wiring substrate 1 through the bump electrodes 62 therebetween. A tin layer formed by electroless plating may be provided on the surfaces of the first connection pads P1 or the like in the wiring substrate 1.

At this time, when the reflow heating is performed, thermal stress is generated due to the difference in thermal expansion coefficient between the aluminum oxide substrate 10 and the semiconductor chip 60. But, in the wiring substrate 1 of this embodiment, the elastic body 40 is integrally formed in the pasts of the aluminum oxide substrate 10 in the periphery of the first connection pads P1, and penetrating in the thickness direction thereof.

For this reason, even when stress which causes vertical or horizontal displacement is generated within the wiring substrate 1, the stress can be absorbed and relaxed.

By this matter, the semiconductor chip 60 can be reliably flip-chip connected to the wiring substrate 1, and long-term reliability of the semiconductor device can be secured.

Further, external connection terminals 64 are provided by, for example, mounting solder balls on the second connection pads P2 and each connecting part of the second power plane 52a and the second ground plane 52b on the lower face side of the wiring substrate 1.

In the wiring substrate 1 of this embodiment, in order to relax the stress by using the function of the elastic body 40 filled into the inside of the substrate, the elastic body 40 is arranged desirably in a free state. In view of this, the underfill resin which is to be filled under the semiconductor chip 60 functions so as to fix the elastic body 40, and therefore the structure in which the underfill resin is omitted is desirable.

In the case that it is not problematic even when the elastic body 40 is fixed by the underfill resin, forming such underfill resin is allowable.

The semiconductor chip 60 is illustrated as an example of an electronic component to be mounted. The wiring substrate of this embodiment can be used as a mount substrate for various kinds of electronic components. Moreover, the wiring substrate of this embodiment may be used as an interposer arranged between a mounting substrate and an electronic component.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a wiring substrate, comprising:
preparing an insulating substrate including a plurality of through-holes;
forming an insulating layer having an annular pattern on the insulating substrate;
forming a seed metal layer on the insulating substrate and the insulating layer;
filling penetration conductors into the through-holes of the insulating substrate by electroplating using the seed metal layer as a power feeding path;
forming an opening portion by removing a part of the insulating substrate under the insulating layer; and
filling an elastic body into the opening portion of the insulating substrate.

(Clause 2) The method of manufacturing a wiring substrate according to Clause 1, further comprising, after the filling the elastic body, removing the seed metal layer until the insulating layer is exposed, thereby forming a first connection pad in an inside of the insulating layer having the annular pattern, and forming a first metal layer to an outside of the insulating layer.

(Clause 3) The method of manufacturing a wiring substrate according to Clause 2, wherein the filling the penetration conductors includes:
forming a second connection pad on a lower face of a part of the insulating substrate corresponding to the first connection pad, the second connection pad connected to the penetration conductors; and
forming a second metal layer on a lower face of a part of the insulating substrate corresponding to the first metal layer, the second metal layer connected to the penetration conductors.

(Clause 4) The method of manufacturing a wiring substrate according to Clause 3, wherein each of the first metal layer and the second metal layer is formed to be divided into two or more.

(Clause 5) The method of manufacturing a wiring substrate according to Clause 1, wherein
the insulating substrate is an aluminum oxide substrate, and
the penetration conductors are formed at a density in a range of $4\times10^6$ conductors/mm$^2$ to $1\times10^{10}$ conductors/mm$^2$.

What is claimed is:

1. A wiring substrate, comprising:
an insulating substrate in which a plurality of penetration conductors are provided, the penetration conductors penetrating in a thickness direction of the insulating substrate; a first connection pad arranged on one face of the insulating substrate;
a second connection pad arranged to correspond to the first connection pad on the other face of the insulating substrate; a first metal layer arranged to surround the first connection pad; a second metal layer arranged to correspond to first metal layer, the second metal layer surrounding the second connection pad; the plurality of penetration conductors connecting the first connection pad and the second connection pad, and connecting the first metal layer and the second metal layer, wherein the penetration conductors contact one surface of the first connection pad except a side surface and one surface of the second connection pad except a side surface respectively;
an elastic body formed in a part of the insulating substrate between a region where the first connection pad and second connection pad are arranged, and a region where the first metal layer and second metal layer are arranged, wherein the elastic body is formed to surround the penetration conductors and the insulating substrate, and is provided between the first connection pad and the second connection pad with an annular shape, and a material of the elastic body is different from a material of the insulating substrate; and an insulating layer arranged between the first connection pad and the first metal layer, the insulating layer formed on the elastic body to surround the first connection pad with an annular shape, wherein the insulating layer, the elastic body and the insulating substrate are formed from different material respectively.

2. The wiring substrate according to claim 1, wherein each of the first, metal layer and the second metal layer is divided into two or more.

3. The wiring substrate according to claim 1, wherein
the insulating substrate is an aluminum oxide substrate, and
the penetration conductors are formed at a density in a range of $4\times10^6$ conductors/mm$^2$ to $1\times10^{10}$ conductors/mm$^2$.

4. The wiring substrate according to claim 2, wherein
in each of the first metal layer and the second metal layer, divided and adjoined metal layers are a power pattern and a ground pattern, and
the plurality of penetration conductors which are electrically isolated are arranged in a part of the insulating substrate where the first metal layer and the second metal layer are divided.

* * * * *